United States Patent
Kalb

[19]

[11] Patent Number: 5,923,275
[45] Date of Patent: Jul. 13, 1999

[54] ACCURATE CHARGE-DIVIDING DIGITAL-TO-ANALOG CONVERTER

[75] Inventor: Arthur J. Kalb, San Jose, Calif.

[73] Assignee: National Semiconductor Corporation, Santa Clara, Calif.

[21] Appl. No.: 08/955,904

[22] Filed: Oct. 22, 1997

[51] Int. Cl.[6] .................................................. H03M 1/66
[52] U.S. Cl. ........................................... 341/150; 341/144
[58] Field of Search ..................................... 341/118, 120, 341/144, 150

[56] References Cited

U.S. PATENT DOCUMENTS

| | | | |
|---|---|---|---|
| 4,523,179 | 6/1985 | Kapral | 341/150 |
| 4,746,903 | 5/1988 | Czarniak et al. | 341/144 |
| 4,905,006 | 2/1990 | Pelgrom | 341/150 |
| 5,453,757 | 9/1995 | Date et al. | 345/89 |
| 5,696,509 | 12/1997 | Maejima | 341/150 |
| 5,781,139 | 7/1998 | Weisbrod | 341/150 |

Primary Examiner—Marc S. Hoff
Attorney, Agent, or Firm—Skjerven, Morrill, MacPherson, Franklin & Friel LLP; Tom Chen

[57] ABSTRACT

A structure and a method are provided to convert the value of a digital word to an analog signal representing that value, using a small and simple charge divide-by-four circuit with one op amp. The D/A converter thus provided greatly reduces the effects of capacitor mismatch. The D/A converter processes one bit pair at a time and stores a corresponding charge. This charge is divided by four prior to processing the next bit pair. In one embodiment, the D/A converter has one operational amplifier, two capacitors, and seven switches. In another embodiment, the same number of elements are used in a different configuration, which allows an offset correction to be performed. In yet another embodiment, the D/A converter has one op amp, four capacitors, and eleven switches, which allows both offset voltage and gain compensation correction.

22 Claims, 4 Drawing Sheets

| CLOCK CYCLE | 1 | 2 | 3 | 4 | 5 | 6 | 7 | 8 | 9 | 10 | 11 |
|---|---|---|---|---|---|---|---|---|---|---|---|
| SW1 | 0 | $b_0 \oplus S$ | S | $b_1 \oplus S$ | S | $b_1 \oplus S$ | S | 0 | 0 | 0 | 0 |
| SW2 | 1 | $b_0 \oplus \bar{S}$ | $\bar{S}$ | $b_1 \oplus \bar{S}$ | $\bar{S}$ | $b_1 \oplus \bar{S}$ | $\bar{S}$ | 1 | 0 | 0 | 0 |
| SW3 | 0 | 0 | 1 | 0 | 1 | 0 | 1 | 0 | 1 | 1 | 1 |
| SW4 | 1 | 1 | 0 | 1 | 0 | 1 | 0 | 1 | 0 | 0 | 0 |
| SW5 | 1 | 1 | 1 | 1 | 1 | 1 | 1 | 1 | 1 | 0 | 1 |
| SW6 | 1 | 0 | 0 | 0 | 0 | 0 | 0 | 0 | 0 | 1 | 0 |
| SW7 | 0 | 0 | 0 | 0 | 0 | 0 | 0 | 0 | 1 | 1 | 1 |

| | | FUNCTION |
|---|---|---|
| | 1 | RESET |
| | 2 | STORE $b_0$ |
| | 3 | INTEGRATE $b_0$ |
| | 4 | STORE $b_1$ |
| CLOCK CYCLE | 5 | INTEGRATE $b_1$ |
| | 6 | STORE $b_1$ |
| | 7 | INTEGRATE $b_1$; IF LAST BIT PAIR, THEN STOP |
| | 8 | CLEAR C1 |
| | 9 | DIVIDE BY 2 |
| | 10 | CLEAR C2 |
| | 11 | DIVIDE BY 2; THEN GO TO CLOCK #2 AND CONTINUE |

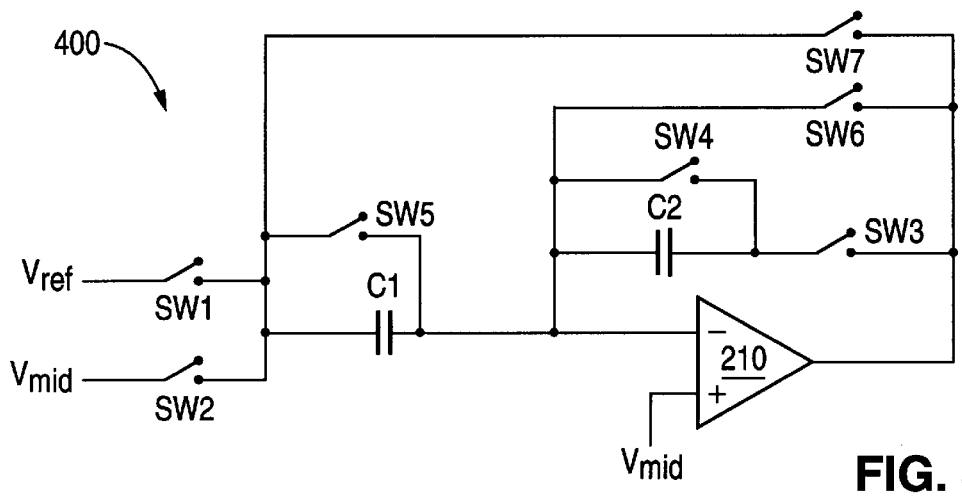

FIG. 4

CLOCK CYCLE

| | 1 | 2 | 3 | 4 | 5 | 6 | 7 | 8 | 9 | 10 | 11 |
|---|---|---|---|---|---|---|---|---|---|---|---|
| SW1 | S | S | $b_0 \oplus S$ | S | $b_1 \oplus S$ | S | $b_1 \oplus S$ | 0 | 0 | 0 | 0 |
| SW2 | $\bar{S}$ | $\bar{S}$ | $b_0 \oplus \bar{S}$ | $\bar{S}$ | $b_1 \oplus \bar{S}$ | $\bar{S}$ | $b_1 \oplus \bar{S}$ | 0 | 0 | 0 | 0 |
| SW3 | 0 | 0 | 1 | 0 | 1 | 0 | 1 | 1 | 1 | 0 | 1 |
| SW4 | 1 | 0 | 0 | 0 | 0 | 0 | 0 | 0 | 0 | 1 | 0 |
| SW5 | 0 | 0 | 0 | 0 | 0 | 0 | 0 | 1 | 0 | 0 | 0 |
| SW6 | 1 | 1 | 0 | 1 | 0 | 1 | 0 | 0 | 0 | 0 | 0 |
| SW7 | 0 | 0 | 0 | 0 | 0 | 0 | 0 | 0 | 1 | 1 | 1 |

FIG. 5A

| | | FUNCTION |
|---|---|---|
| | 1 | RESET |
| | 2 | STORE OFFSET ON C1 |
| | 3 | INTEGRATE $b_0$ |
| | 4 | STORE OFFSET ON C1 |
| CLOCK CYCLE | 5 | INTEGRATE $b_1$ |
| | 6 | STORE OFFSET ON C1 |
| | 7 | INTEGRATE $b_1$ ; IF LAST BIT PAIR, THEN STOP |
| | 8 | CLEAR C1 |
| | 9 | DIVIDE BY 2 |
| | 10 | CLEAR C2 |
| | 11 | DIVIDE BY 2; THEN GO TO CLOCK #2 AND CONTINUE |

ACCURATE CHARGE-DIVIDING DIGITAL-TO-ANALOG CONVERTER

BACKGROUND OF THE INVENTION

1. Field of the Invention

The present invention relates to digital-to-analog (D/A) converters and in particular, to an accurate D/A conversion using a charge divide-by-four circuit.

2. Discussion of the Related Art

Conventional algorithm-based digital-to-analog converters (DACs) sample bits of a digital word and convert them to an analog quantity, such as a voltage. In some DACs, a quantity of charge corresponding to the value of the digital word is stored and a converted analog quantity representing the amount of charge, such as a voltage, is measured at an output. For example, conventional switched-capacitor DACs convert incoming bits to corresponding voltages and then utilize switches to control the charging and discharging of various capacitors in response to the incoming bits in order to accumulate charge on the capacitors representing the value of the digital word. The charge or a resulting voltage can then be measured to obtain the converted analog quantity. However, the accuracy of the conversion depends on how well the capacitors are matched. Ideally, they should be of the same capacitance, and any deviations or mismatch in capacitance can result in conversion errors.

Czarniak et al. disclose a DAC in U.S. Pat. No. 4,746,903 entitled "Parallel Algorithmic Digital to Analog Converter", which utilizes a divide-by-4 circuit to greatly reduce the effects of capacitor mismatch. However, Czarniak et al.'s DAC, which is shown as DAC 100 in FIG. 1, requires three operational amplifiers (op amps), five capacitors and nineteen switches. DAC 100 includes subcircuits 10 and 30 for voltage addition, multiplication by 2, and divide by 4 and subcircuit 50 for tracking an analog signal from subcircuit 10 and holding the instantaneous value of that signal while subcircuit 10 proceeds with further processing. Subcircuit 10 has one op amp 11, two capacitors 12 and 13, and eight switches 14–21. Similarly, subcircuit 30 has one op amp 31, two capacitors 32 and 33, and eight switches 34–41, while subcircuit 50 has one op amp 51, one capacitor 52, and three switches 53–55. The nineteen switches are switched on and off, as described in Czarniak et al., to achieve desired multiplication, division, and addition operations for providing an accurate analog conversion of a digital signal.

Accordingly, it is desirable to provide a smaller and less complicated DAC where capacitor mismatching has a greatly reduced effect on the conversion accuracy.

SUMMARY OF THE INVENTION

The present invention provides a small and simple divide-by-four D/A converter (DAC) and a method utilizing one operational amplifier (op amp) which accurately converts a digital value to an analog value and which is relatively immune to effects due to capacitor mismatch.

In one embodiment of the present invention, the bits in a digital word are sampled two bits or one bit pair at a time until all bits are converted to produce an analog output. A voltage corresponding to the value of the least significant bit of the first bit pair is used to charge an input capacitor, i.e., "storing" the bit. An op amp then integrates the voltage across the input capacitor to provide a charge onto an output capacitor representing that voltage, i.e., "integrating" the bit. Charge is then held on the output capacitor while charge on the input capacitor is cleared. Next, the second bit of the bit pair is stored and integrated, which accumulates charge with the charge previously stored on the output capacitor. The second bit is stored and integrated again because its location value is twice that of the preceding bit location, resulting in a charge on the output capacitor corresponding to the value of the first bit pair. If no more bit pairs exist, then conversion ends and the desired result is obtained at the output of the DAC. However, if there are more bit pairs, then conversion continues by dividing the charge on the output capacitor by four and clearing the input capacitor and then sampling and integrating the next bit pair. This process continues until all bit pairs of the digital word are converted to one corresponding analog charge or voltage.

In one implementation of this embodiment, a D/A converter utilizes one op amp, two capacitors, and seven switches. Input voltages, representing a binary "1" and a binary "0", are connected to terminals of the first and second switches, respectively. The other terminals of the first and second switches are commonly connected to a plate of an input capacitor and to a terminal of the seventh switch. The input voltage representing a binary "0" is also connected to a terminal of the fourth switch, whose other terminal is connected to the other plate of the input capacitor and to a terminal of the third switch. The inverting input terminal of the op amp is connected to the other terminal of the third switch, to a terminal of the sixth switch, and to a plate of an output capacitor. The non-inverting input terminal is connected to the input voltage representing the binary "0". The other terminal of the sixth switch is connected between the other plate of the output capacitor and a terminal of the fifth switch. The output terminal of the op amp, which provides the output value of the D/A converter, is connected to the other terminals of the fifth and seventh switches.

In another embodiment, a DAC can correct for the offset voltage of the op amp during the conversion process. Prior to storing each bit, the offset voltage is used to charge the input capacitor, i.e., "storing" the offset voltage. Thus, when each bit is stored and integrated, only the voltage representing that bit, without the offset voltage, is provided to the output capacitor. As a result, the converted analog voltage is measured without the op amp offset voltage.

In one implementation of this embodiment, a DAC again uses one op amp, two capacitors, and seven switches, but in a different configuration. Input voltages, representing a binary "1" and a binary "0", are connected to terminals of the first and second switches, respectively. Terminals of the fourth, fifth, and sixth switches and plates of an input and output capacitor are commonly connected to the inverting input terminal of the op amp. The non-inverting input terminal is connected to the voltage representing a binary "0". The other terminals of the first and second switches are commonly connected to the other plate of the input capacitor, to the other terminal of the fifth switch, and to a terminal of the seventh switch. The other terminal of the fourth switch is connected between the other plate of the output capacitor and a terminal of the third switch. The other terminals of the third, sixth and seventh switches are commonly connected to the output of the op amp.

In yet another embodiment, both the offset voltage of the op amp and the gain error due to a finite gain of the op amp can be corrected during the D/A conversion process. The offset is first stored onto two input capacitors. Next, the first bit of a bit pair is stored onto the first input capacitor and integrated to provide a voltage on a first of two output capacitors, while a voltage representing the gain error charges the second input capacitor, i.e., "storing" the gain error. As a result, the voltage across the first output capacitor represents the first bit without the offset voltage, and the voltage across the second input capacitor includes both the offset voltage and the gain error voltage. The first bit is then stored onto the second input capacitor and integrated so that the voltage across the second output capacitor represents the first bit without the op amp offset and gain error. This process is repeated twice for the second bit, resulting in a voltage across the second output capacitor corresponding to the value of the first bit pair without any offset or gain error.

If no more bits exist, then the voltage measured across the second output capacitor is the desired analog quantity. However, if there are more bits, then the charge on the second output capacitor is divided by four and the next bit pair is stored and integrated. This process continues until all bits in the digital word are converted.

In one implementation of this embodiment, a DAC uses one op amp, four capacitors, and eleven switches. Input voltages, representing a binary "1" and a binary "0", are connected to terminals of the second and third switches, respectively, and also to terminals of the sixth and seventh switches, respectively. The other terminals of the second and third switches are commonly connected to a plate of a first input capacitor, with the other plate connected to a terminal of the fourth switch. The other terminals of the sixth and seventh switches are commonly connected to a plate of a second input capacitor, with the other plate connected to a terminal of the eighth switch. The other terminals of the fourth and eighth switches and terminals of the first, fifth and ninth switches are commonly connected to the inverting input terminal of the op amp. The non-inverting input terminal is connected to the voltage representing a binary "0". A first output capacitor is connected in series between The ninth and eleventh switches, which open and close together. simiarly, a second output capacitor is connected in series between the fifth and tenth switches, which also open and close together. The other terminals of the first, tenth, and eleventh switches are commonly connected to the output of the op amp.

This invention will be more fully understood in light of the following detailed description taken along with the accompanying drawings.

BRIEF DESCRIPTION OF THE DRAWINGS

FIG. 4 is a schematic circuit diagram of another embodiment of a D/A converter according to the present invention;

FIG. 5A is a timing table for the D/A converter of FIG. 4;

FIG. 5B is a table listing functions for the timing table of FIG. 5A;

Use of the same reference numbers in different figures indicates similar or like elements.

DETAILED DESCRIPTION

A structure and a method for digital-to-analog (D/A) conversion are provided which utilize a simplified implementation of a charge divide-by-four circuit employing one operational amplifier (op amp) to minimize the effect of capacitor mismatch on the accuracy of D/A conversion. In the following description, a digital word to be converted is represented in a sign magnitude data format, denoted by a signed bit S and binary bits $b_n b_{n-1} b_{n-2} \ldots b_2 b_1 b_0$. However, the D/A converter (DAC) of the present invention can also be used with other data formats, which would then include an initial conversion to the sign magnitude format. Such modifications to the present invention will be appreciated by those skilled in the art.

According to one embodiment of the present invention, a D/A converter samples a signed magnitude digital word, two bits or one bit pair at a time, and converts the value represented by the digital word into a proportional voltage. A charge corresponding to the first or least significant bit pair $b_1 b_0$ is first sampled onto an input capacitor and integrated onto an output capacitor. Bit $b_0$ is first "stored" by using a voltage corresponding to bit $b_0$ to charge the input capacitor. Bit $b_0$ is then "integrated" when an op amp integrates the voltage across the input capacitor to provide a charge onto the output capacitor representing that voltage. Charge is then cleared from the input capacitor, while charge on the output capacitor is held. Next, voltage representing the second bit $b_1$ of the bit pair is used to charge the input capacitor. The voltage across the input capacitor is then integrated by the op amp to provide a corresponding charge onto the output capacitor, which accumulates with the charge previously stored on the output capacitor. Bit $b_1$ is stored and integrated again because its location value is twice that of the location value associated with the preceding bit $b_0$. As a result, charge on the output capacitor corresponds to the value of the first bit pair $b_0 b_1$.

If there are no more bits in the digital word, i.e., $b_n b_{n-1} \ldots b_2$ are zeroes, the voltage corresponding to the charge is the converted output voltage. However, if there are more non-zero bits, the D/A converter divides the charge by four because the positional value associated with the next bit pair $b_3 b_2$ is four times that of the previous bit pair. This next bit pair $b_3 b_2$ is then stored and integrated in the same manner as with bit pair $b_0 b_1$. The charge accumulated on the output capacitor, which is holding the divided-by-four charge, represents the value of $b_3 b_2 b_1 b_0$. If more bits are to be sampled, this process continues until the last non-zero bit pair is sampled, at which point, the conversion is complete.

Figure 1:
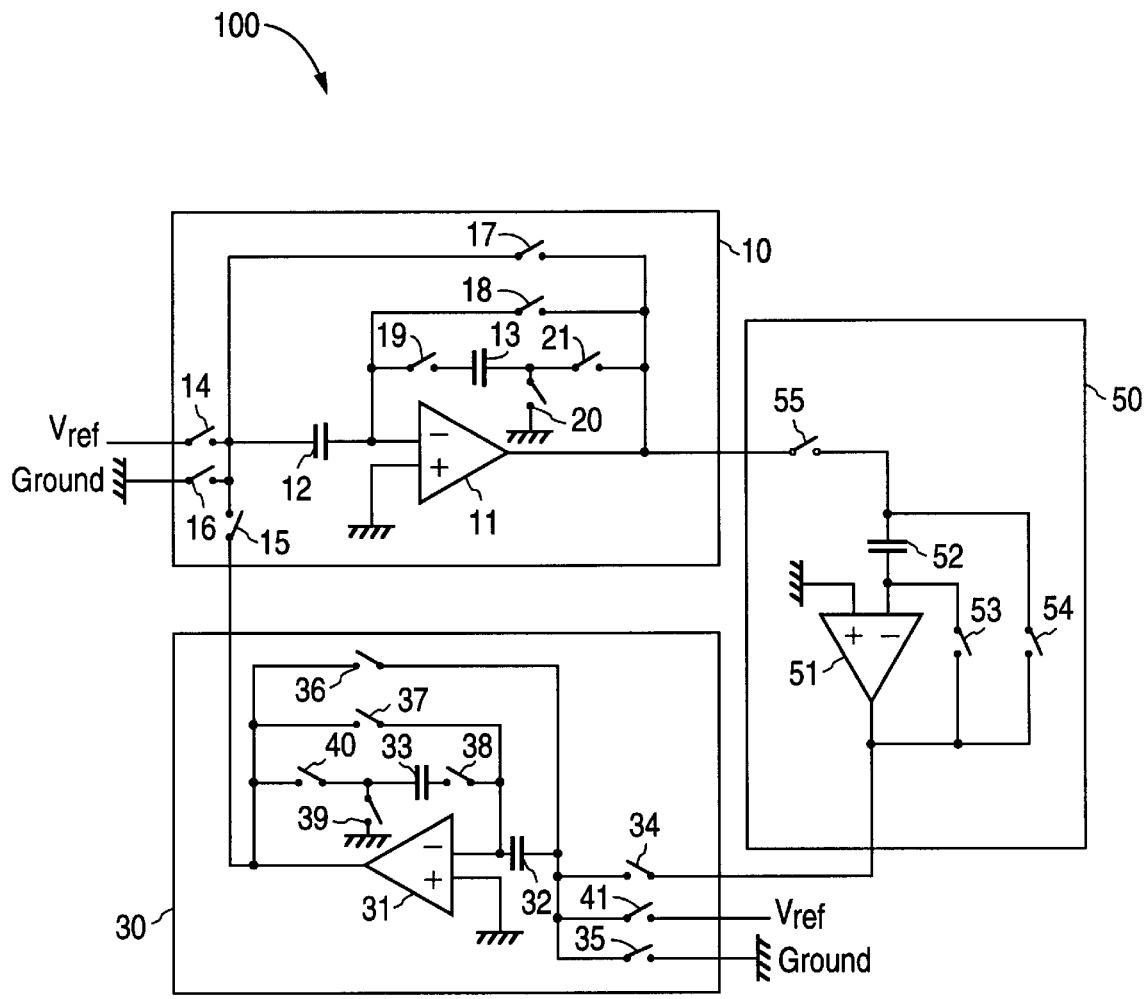
FIG. 1 is a schematic circuit diagram of a conventional D/A converter.
Figures 2, 3A, 3B:
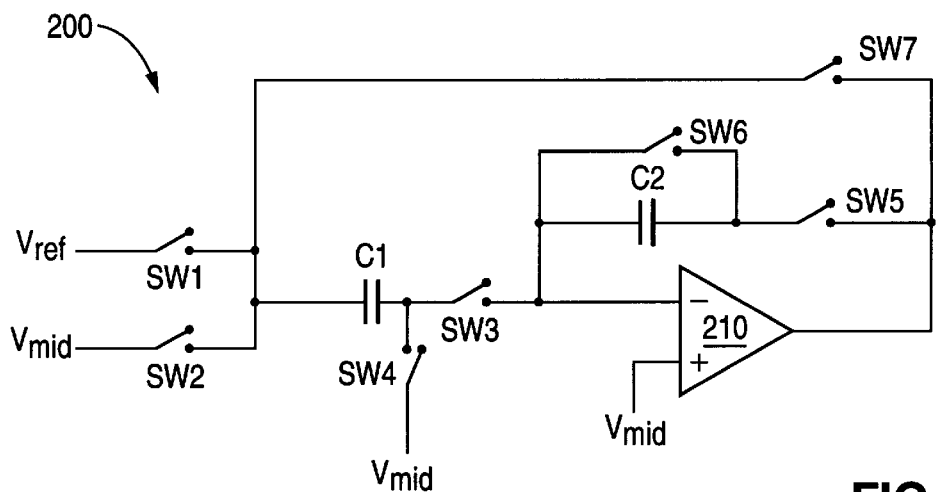
FIG. 2 is a schematic circuit diagram of a D/A converter according to the present invention.
FIG. 3A is a timing table for the D/A converter of FIG. 2.
FIG. 3B is a table listing functions for the timing table of FIG. 3A.

In FIG. 2, a D/A converter 200, according to one implementation of this embodiment, includes an op amp 210, an input capacitor C1, an output capacitor C2, and seven switches SW1–SW7. Capacitors C1 and C2, whose capacitances are c1 and c2, respectively, are mismatched by a small amount x, where $$c2/c1 = 1 + x \quad (1)$$

The inverting input terminal of op amp 210 is connected to first terminals of switches SW3 and SW6 and to a first plate of output capacitor C2. The second terminal of switch SW3 is connected to a first plate of input capacitor C1 and to a first terminal of switch SW4. The second plate of input capacitor C1 is connected to a first terminal of switch SW7 and to first terminals of switches SW1 and SW2, which have their second terminals connected to receive input voltages $V_{ref}$ and $V_{mid}$, respectively representing binary digits "1" and "0". Besides using two switches, other suitable means can be used to select between the two input values, such as one switch having three positions for selecting $V_{ref}$, $V_{mid}$, or neither. Voltage $V_{mid}$ is also received at the second terminal of switch SW4 and at the non-inverting input terminal of op amp 210. The second plate of output capacitor C2 is connected to the second terminal of switch SW6 and a first terminal of switch SW5. The output terminal of op amp 210, which provides the output signal of D/A converter 200, is connected to the second terminals of switches SW5 and SW6.

FIG. 3A is a table showing a portion of the operation of switches SW1–SW7 during conversion of a digital word to an analog value using D/A converter 200 of FIG. 2. In FIG. 3A, a switch position of "1" indicates a closed switch and "0" indicates an open switch. FIG. 3B lists the function performed by D/A converter 200 at each clock cycle of FIG. 3A and the control decisions to be made for continuing the conversion, all of which are discussed in more detail below.

During the first clock cycle, D/A converter 200 resets by opening switches SW1, SW3 and SW7 and closing the remaining switches, thereby discharging capacitors C1 and C2. Sampling then begins at the second clock cycle with bit $b_0$, which is the least significant bit of the binary word. In this second clock cycle, the state of switch SW1 is $b_0 \oplus S$, and the state of switch SW2 is $b_0 \oplus \overline{S}$, switches SW4 and SW5 are closed, and the remaining switches are open. Accordingly, voltage $V_{ref}$ charges input capacitor C1, by closing switch SW1 and opening switch SW2, if sign bit S is "0" and bit $b_0$ is "1" or if sign bit S is "1" and bit $b_0$ is "0". Alternatively, voltage $V_{mid}$ charges input capacitor C1, by opening switch SW1 and closing switch SW2, if sign bit S and bit $b_0$ are both "0" or both "1". Note, for simplicity of description, all switches should be presumed open unless stated otherwise.

In the third clock cycle, op amp 210 integrates the voltage across input capacitor C1, providing a charge representing the integrated voltage on output capacitor C2. To accomplish this, switches SW3 and SW5 are closed, and depending on sign bit S, either switch SW1 (S="1") or SW2 (S="0") is closed.

In the fourth clock cycle, the next bit $b_1$ is processed. Switches SW1–SW7 are controlled in the same manner as described above for the second clock cycle, when bit $b_0$ was processed.

In the fifth clock cycle, the voltage across input capacitor C1, which now corresponds to the value of bit $b_1$, is integrated by op amp 210 in the same manner as described above for the third clock cycle. Because output capacitor C2 is holding the charge associated with bit $b_0$, the resulting charge on output capacitor C2 is the sum of the charges associated with bits $b_0$ and $b_1$. However, to correctly convert the bit pair $b_1 b_0$, the operations of the fourth and fifth clock cycles are repeated in the sixth and seventh clock cycles because bit $b_1$ is weighted twice that of bit $b_0$.

If the remaining bits of the binary word are all zeroes, the resulting charge on output capacitor C2 represents the converted analog quantity. However, if the digital word contains additional non-zero bits, the charge on output capacitor C2 must first be divided by four before the next bit pair is received. This is because the next bit pair is weighted four times the value of the prior bit pair.

If the conversion is incomplete, i.e., an additional non-zero bit pair is to be processed, input capacitor C1 is first discharged during the eighth clock cycle by closing switches SW2, SW4 and SW5. The charge on output capacitor C2 remains.

In the ninth clock cycle, switches SW3, SW5 and SW7 are closed, thus transferring a portion of the charge stored on output capacitor C2 onto input capacitor C1. The amount of charge transferred depends on the respective capacitances of C1 and C2. Assuming charge Q2, corresponding to a voltage V2, was stored on output capacitor C2 after the eighth clock cycle, the resulting charges on capacitors C1 and C2, are, respectively, $$Q1' = Q2 \frac{c1}{(c1+c2)} \text{ and } Q2' = Q2 \frac{c2}{(c1+c2)}.$$

In the tenth clock cycle, output capacitor C2 is discharged by closing switches SW3, SW6 and SW7. Charge Q1' remains on input capacitor C1.

In the eleventh clock cycle, the charge of input capacitor C1 is partially transferred from input capacitor C1 to output capacitor C2. By closing switches SW3, SW5 and SW7, the resulting charge on output capacitor C2 becomes $$Q2'' = Q1' \frac{c2}{(c1+c2)} = Q2 \frac{c1c2}{(c1+c2)^2}.$$

The resulting voltage V, measured at the output of op amp 210, is therefore:

$$V = \frac{Q2''}{c2} = Q2 \frac{c1}{(c1+c2)^2} = V2 \frac{c1c2}{(c1+c2)^2},$$

Because c2=c1(1+x) from equation (1) above, the resulting voltage V can be expressed as:

$$V = V2 \frac{c1c2}{(c1+c2))^2} = V2 \frac{1+x}{(2+x)^2} = V2 \frac{1}{4} + \frac{x}{4(1+x/2)^2}$$

$$\approx \frac{V2}{4} \left(1 - \frac{x^2}{4} + \frac{x^3}{4} - ...\right).$$

Therefore, the charge, and hence the voltage, of output capacitor C2 have been divided by four, with capacitor mismatch creating a maximum error of second order dependence.

Each successive bit pair can be processed according to the sequence described above in conjunction with FIGS. 3*a* and 3*b*, beginning at the second clock cycle. In the processing of the last non-zero bit pair, the eighth to eleventh clock cycles are not performed.

As a result, an accurate divide-by-four D/A converter, which has one op amp, seven switches, and two capacitors, is made much smaller and simpler than the one disclosed in Czarniak et al.

In another embodiment, a D/A converter can correct for the offset voltage of the op amp during the conversion process. Prior to storing each bit on the input capacitor, the offset is stored on the input capacitor by using to the offset voltage to charge the input capacitor. Thus, when each bit is subsequently stored and integrated, only the voltage representing that bit, without the offset voltage, is provided to the output capacitor. As a result, the converted analog voltage is measured without the op amp offset.

FIG. 4 shows a D/A converter 400, in accordance with one implementation of this embodiment of the present invention. Again, only one op amp 210, seven switches SW1–SW7, and two capacitors C1 and C2 are used. The inverting input terminal of op amp 210 is connected to first terminals of switches SW4–SW6 and to first plates of capacitors C1 and C2. The second plate of input capacitor C1 is connected to a first terminal of switch SW7, to the second terminal of switch SW5, and to first terminals of switches SW1 and SW2, which have their second terminals connected to input voltages $V_{ref}$ and $V_{mid}$, respectively, representing the binary digits "1" and "0". The second plate of output capacitor C2 is connected to a first terminal of switch SW3 and to the second terminal of switch SW4. The output of op amp 210 is connected to the second terminals of switches SW3, SW6 and SW7. The non-inverting input terminal of op amp 210 is connected to voltage representing binary "0".

FIG. 5A is a table showing a portion of the state of the switches for the operation of D/A converter 400 of FIG. 4, and FIG. 5B lists the function performed at each clock cycle by D/A converter 400.

In the first clock cycle, switches SW4 and SW6 are closed to reset or discharge output capacitor C2. Also, depending on the value of sign bit S, either switch SW1 (S=1) or SW2 (S=0) is closed to store the offset on input capacitor C1.

In the second clock cycle, switch SW6 is closed, either switch SW1 or SW2 is also closed, with the same dependency on sign bit S, to hold any charges on output capacitor C2 and to store the offset on input capacitor C1.

In the third clock cycle, the first input bit $b_0$ is received, and the voltage across input capacitor C1 is integrated by closing switch SW3 and either switch SW1 or SW2, depending on the values of sign bit S and bit $b_0$, in the same manner discussed with respect to D/A converter 200 of FIG. 2. (That is, switch SW1 is closed when $b_0 \oplus S$ evaluates to true; and switch SW2 is closed when $b_0 \oplus S$ evaluates to true.) Bit $b_0$ is thus stored onto input capacitor C1 along with the offset. The voltage across input capacitor C1 is integrated by op amp 210, so that the charge put on output capacitor C2 represents bit $b_0$ minus the offset voltage across input capacitor C1.

During the fourth clock cycle, the offset is stored on input capacitor C1, using the same configuration of switches SW1 to SW7 as the second clock cycle. In the fifth clock cycle, the second bit $b_1$ is processed in the same manner as bit $b_0$ was processed during the third clock cycle. Since bit $b_1$ is weighted twice bit $b_0$, the operations of the fourth and the fifth clock cycles are repeated in the sixth and seventh clock cycles. Thus, the analog value of bits $b_1 b_0$ is provided on output capacitor C2, and hence the output voltage is provided at the output of op amp 210.

If the remaining bits of the digital word are zero, then this output voltage of op amp 210 corresponds to the converted analog representation of the digital word. However, if there are additional non-zero bits, the charge stored on output capacitor C2 is divided by four. To perform a divide-by-four operation, at the eighth clock cycle, input capacitor C1 is first discharged by closing switches SW3 and SW5. Then, in the ninth clock cycle, switches SW3 and SW7 are closed, so that the charge on output capacitor C2 is divided equally between capacitors C1 and C2. The operations of the eighth and ninth clock cycles are then repeated in the tenth and eleventh clock cycles to further divide the charge on output capacitor C2 by two, thus completing the divide-by-four operation. The operations of the second to seventh clock cycles are then repeated for the next bit pair. D/A conversion completes when all bit pairs are processed.

In yet another embodiment of the present invention, both the offset voltage of the op amp and the gain error due to a finite gain of the op amp can be corrected by the D/A converter. The off set is first stored on two input capacitors. Next, the first bit $b_0$ of a bit pair is stored on the first input capacitor and the corresponding voltage integrated to provide a voltage on a first of two output capacitors. At the same time, the gain error is stored on the second input capacitor by charging the second input capacitor with the voltage representing the gain error. As a result, the voltage across the first output capacitor represents $b_0$ without the offset voltage, and the voltage across the second input capacitor represents both the op amp offset and gain error. Bit $b_0$ is then stored on the second input capacitor and integrated so that the voltage across the second output capacitor represents bit $b_0$ without the op amp offset and gain error. This process is repeated twice for the second bit $b_1$, resulting in a voltage across the second output capacitor corresponding to the value of the first bit pair $b_1 b_0$ without any offset or gain error.

If no more bits exist, then the voltage measured across the second output capacitor is the desired analog quantity. However, if there are more bits, then the charge on the second output capacitor is divided by four, and the next bit pair $b_3 b_2$ is stored and integrated. This process continues until all bits in the digital word are converted.

Figure 6:
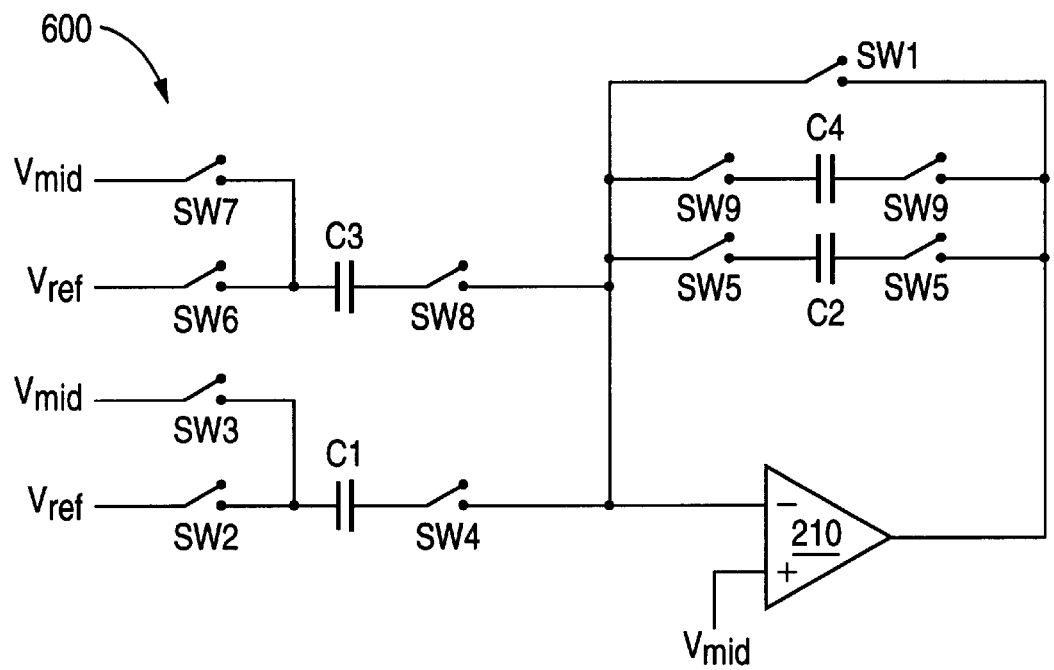
FIG. 6 is a schematic circuit diagram of yet another embodiment of a D/A converter according to the present invention.

FIG. 6 shows a D/A converter 600 according to one implementation of this embodiment. The inverting input terminal of op amp 210 is connected to first terminals of switches SW1, SW4, SW8, SW5a and SW9a. A first plate of a first input capacitor C1 is connected to the second terminal of switch SW4, and the second plate of first input capacitor C1 is connected to first terminals of switches SW2 and SW3, whose second terminals are connected to receive voltages $V_{ref}$ and $V_{mid}$, respectively, representing a binary "1" and a binary "0". Similarly, a first plate of a second input capacitor C3 is connected to the second terminal of switch SW8, and the second plate of second input capacitor C3 is connected to first terminals of switches SW6 and SW7, whose second terminals are connected to receive voltages $V_{ref}$ and $V_{mid}$, respectively. The output terminal of op amp 210 is connected to the second terminals of switch SW1, and to first terminals of switches SW5b and SW9b, and the non-inverting input terminal of op amp 210 is connected to receive $V_{mid}$. First output capacitor C2 is connected in series between switches SW5a and SW5b. Similarly, a second output capacitor C4 is connected in series between switches SW9a and SW9b. Because SW5a and SW5b are always in the same open or closed state, in the remaining description, the state of switch "SW5" is understood to be applicable to both switches SW5a and SW5b. Similarly, switches SW9a and SW9b are represented by switch "SW9".

Figure 7:
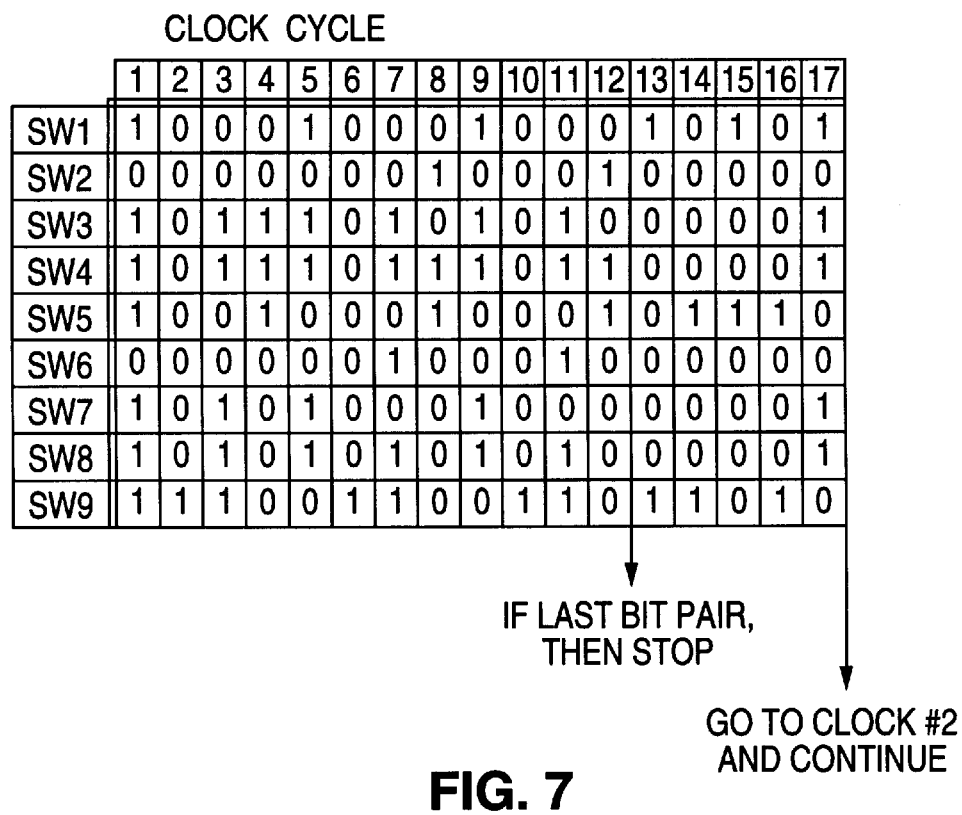
FIG. 7 is a timing table for the D/A converter of FIG. 6.

FIG. 7 shows a portion of a timing table for the operation of switches SW1–SW9 in D/A converter 600 of FIG. 6 when a bit pair $b_1 b_0$, having bit pattern "10" is received. Also, for ease of description, a sign bit of 0 is assumed. However, upon consideration of this detailed description, those skilled in the art will appreciate the changes in the control of switches SW1 to SW9 necessary when the sign bit is 1 and/or when receiving any pattern for a bit pair in general.

In the first clock cycle, switches SW1, SW3–SW5 and SW7–SW9 are closed, thereby discharging output capacitors C2 and C4 and charging capacitors C1 and C3 each with a voltage representing the op amp offset. During the second clock cycle, switch SW9 is closed to allow charge to settle in second output capacitor C4. During the third clock cycle, switches SW3, SW4 and SW9 are closed to store bit $b_0$, i.e. a binary "0" represented by voltage $V_{mid}$, on second input capacitor C3 and to integrate the voltage across second input capacitor C3 to provide a voltage on the second output capacitor C4 without the offset voltage. During the third clock cycle, switches SW3 and SW4 are also closed to store the gain error, i.e. due to a finite gain, onto first input capacitor C1, which already holds charge corresponding to the offset voltage.

During next clock cycle, i.e., the fourth clock cycle, switches SW3–SW5 are closed to receive the same input bit $b_0$ of binary "0" onto first input capacitor C1 holding op amp 210's offset voltage and gain error voltage. As in first output capacitor C4, op amp 210 places on second output capacitor C2 a charge which is independent of op amp 210's offset voltage and gain error voltage.

During the fifth clock cycle, the offset is again stored on input capacitors C1 and C3 by closing switches SW1, SW3, SW4, SW7 and SW8. During the sixth clock cycle, by closing switch SW9, the charge on second output capacitor C4 is allowed to settle.

During the seventh clock cycle, by closing switches SW6, SW8 and SW9, the second bit $b_1$ of the bit pair (a binary "1") is received onto second input capacitor C3 and the voltage across second input capacitor C3 is integrated to provide a charge on second output capacitor C4 which is independent of the offset. At the same time, switches SW3 and SW4 are also closed to accumulate, with the offset on first input capacitor C1, a charge corresponding to the gain error voltage.

During the eighth clock cycle, by closing switches SW2 and SW4, voltage $V_{ref}$ charges first input capacitor C1 which, in turn, accumulates on first input capacitor C1 a charge corresponding to bit $b_1$ with the held charge corresponding to the offset voltage and gain error voltage. Also during the eighth clock cycle, switch SW5 is closed to integrate the voltage across first input capacitor C1 to provide a charge onto first output capacitor C2 representing bit $b_1$ without the offset voltage and gain error voltage. As discussed above, since bit $b_1$ is weighted twice that of bit $b_0$, the operations of the fifth through eighth clock cycles are repeated to double to charge representing the second input bit of the bit pair $b_1 b_0$.

If there are no additional non-zero bit pairs of the digital word to be received, the result of the analog conversion is measured at the output terminal of op amp 210 corresponding to the charge on first output capacitor C2. However, if there is an additional non-zero bit pair, the charge on first output capacitor C2 is divided by four in the thirteenth through sixteenth clock cycles. At the thirteenth clock cycle, switches SW1 and SW9 are closed to discharge second output capacitor C4. Half the charge on first output capacitor C2 is then transferred to second output capacitor C4 by closing switches SW5 and SW9 during the fourteenth clock cycle.

During the fifteenth clock cycle, switches SW5 and SW9 are closed to discharge first output capacitor C2. Then, during the sixteenth clock cycle, switches SW5 and SW9 are closed, so that half the charge on second output capacitor C4 is transferred to first output capacitor C2. Thus, the overall effect of the operations between the thirteenth clock cycle and the sixteenth clock cycle is the division of the charge on first output capacitor C2 by four.

In the seventeenth clock cycle, input capacitors C1 and C3 are discharged by closing switches SW1, SW3, SW4, SW7 and SW8. The divided-by-four charge is held by output capacitors C2 and C4. Bit pairs are then received and processed in accordance with the operations illustrated above, until all non-zero bit pairs are processed.

The above-described embodiments of the present invention are merely meant to be illustrative of the present invention and not intended to be limiting. It will thus be apparent to those skilled in the art, upon consideration of the above detailed description and drawings, that various changes and modifications may be made within the scope of the present invention. For example, the D/A converters can be pipelined to improve conversion throughput. Further, instead of single-ended op amps, D/A converters can be implemented using full differential amplifiers with two inputs and two outputs. Therefore, the appended claims encompass all such changes and modifications as fall within the scope of this invention.

I claim:

1. A method of converting digital to analog using a single operational amplifier, comprising the steps of:

(a) clearing an input capacitor;

(b) storing a first value representing a first bit of a digital word onto said input capacitor;

(c) integrating the voltage across said input capacitor to provide a corresponding charge on an output capacitor;

(d) clearing said input capacitor;

(e) storing a second value representing a second bit of said digital word onto said input capacitor;

(f) integrating the voltage across said second value to provide a corresponding charge on said output capacitor;

(g) clearing said input capacitor;

(h) storing a second value representing a second bit of said digital word again onto said input capacitor;

(i) integrating the voltage again across said second value to provide a corresponding charge on said output capacitor, wherein the accumulated charge stored on said output capacitor represents said first and second bits;

(j) ending the converting process if said digital word contains no more bits;

(k) continuing the converting process if said digital word contains more bits by clearing said input capacitor and transferring half the charge on said output capacitor to said input capacitor;

(l) clearing said output capacitor;

(m) transferring half the charge on said input capacitor to said output capacitor; and (n) repeating steps (a)–(m) until all bits of said digital word are converted.

2. The method of claim 1, further comprising the steps of:

storing an offset voltage from said operational amplifier onto said input capacitor after each of said steps (a), (d) and (g).

3. The method of claim 2, further comprising the steps of:

storing a gain error voltage from said operational amplifier onto said input capacitor after each of said steps (a), (d) and (g).

4. A charge divide-by-four digital-to-analog converter for converting a string of input bits two bits at a time, comprising:

an operational amplifier;

an input capacitor;

an output capacitor;

a plurality of switches coupling said input bits to said input capacitor and coupling said input capacitor to said output capacitor and said operational amplifier, wherein said plurality of switches are opened and closed to store and integrate a first bit to provide a charge on said output capacitor, to clear said input capacitor, to store and integrate a second bit to accumulate charge on said output capacitor, to clear said input capacitor, to store and integrate said second bit again to accumulate charge on said output capacitor, and if more input bits exist, to divide the charge on said output capacitor by four and continue storing and integrating a next two input bits until no more input bits exist.

5. The converter of claim 4, wherein said plurality of switches are further opened and closed to store an offset from said operational amplifier onto said input capacitor prior to each of the integrations.

6. The converter of claim 5, wherein said plurality of switches are further opened and closed to store a gain error onto said input capacitor prior to each of the integrations.

7. The converter of claim 4, wherein said converter consists of only one operational amplifier.

8. The converter of claim 7, wherein said operational amplifier is single-ended.

9. The converter of claim 4, wherein said operational amplifier is fully differential.

10. The converter of claim 4, wherein:
said input bits are represented by a first voltage representing a binary "1" and a second voltage representing a binary "0"; and
said plurality of switches comprises:
means for selectively coupling either said first or second voltage to a first plate of said input capacitor;
a first switch coupling said second voltage to a second plate of said input capacitor;
a second switch coupling the second plate of said input capacitor to an input of said operational amplifier and to a first plate of said output capacitor;
a third switch connected in parallel with said output capacitor;
a fourth switch connected between said third switch and an output of said operational amplifier; and
a fifth switch connected between the first plate of said input capacitor and the output of said operational amplifier.

11. The converter of claim 10, wherein said means comprises a sixth switch coupling said first and second voltages to the first plate of said input capacitor.

12. The converter of claim 10, wherein said means comprises a sixth switch coupling said first voltage to the first plate of said input capacitor, and a seventh switch coupling said second voltage to the first plate of said input capacitor.

13. The converter of claim 4, wherein:
said input bits are represented by a first voltage representing a binary "1" and a second voltage representing a binary "0"; and
said plurality of switches comprises:
means for selectively coupling either said first or second voltage to a first plate of said input capacitor;
a first switch connected in parallel with said input capacitor, a second plate of said input capacitor coupled to an input of said operational amplifier;
a second switch connected in parallel with said output capacitor, a first plate of said output capacitor coupled to the input of said operational amplifier;
a third switch connected between said second switch and an output of said operational amplifier;
a fourth switch connected between the input and an output of said operational amplifier; and
a fifth switch connected between the first plate of said input capacitor and the output of said operational amplifier.

14. The converter of claim 13, wherein said means comprises a sixth switch coupling said first and second voltages to the first plate of said input capacitor.

15. The converter of claim 13, wherein said means comprises a sixth switch coupling said first voltage to the first plate of said input capacitor, and a seventh switch coupling said second voltage to the first plate of said input capacitor.

16. The converter of claim 4, wherein:
said input bits are represented by a first voltage representing a binary "1" and a second voltage representing a binary "0"; and
said plurality of switches comprises:
first means for selectively coupling either said first or second voltage to a first plate of said input capacitor;
second means for selectively coupling either said first or second voltage to a first plate of a second input capacitor;
a first switch coupling a second plate of said input capacitor to an input of said operational amplifier;
a second switch coupling a second plate of said second input capacitor to the input of said operational amplifier;
a third and fourth switch separated by said output capacitor and connected in series with said output capacitor, wherein said output capacitor and said third and fourth switches are connected between the input and an output of said operational amplifier;
a fifth and sixth switch separated by a second output capacitor and connected in series with said second output capacitor, wherein said second output capacitor and said fifth and sixth switches are connected between the input and the output of said operational amplifier; and
a seventh switch connected between the input and the output of said operational amplifier.

17. The converter of claim 16, wherein said first means comprises an eighth switch coupling said first and second voltages to the first plate of said first input capacitor.

18. The converter of claim 16, wherein said second means comprises an eighth switch coupling said first and second voltages to the first plate of said second input capacitor.

19. The converter of claim 18, wherein said second means comprises a ninth switch coupling said first and second voltages to the first plate of said second input capacitor.

20. The converter of claim 16, wherein said first means comprises an eighth switch coupling said first voltage to the first plate of said first input capacitor, and a ninth switch coupling said second voltage to the first plate of said first input capacitor.

21. The converter of claim 16, wherein said second means comprises an eighth switch coupling said first voltage to the first plate of said second input capacitor, and a ninth switch coupling said second voltage to the first plate of said second input capacitor.

22. The converter of claim 20, wherein said second means comprises a tenth switch coupling said first voltage to the first plate of said second input capacitor, and an eleventh switch coupling said second voltage to the first plate of said second input capacitor.

* * * * *